US 10,131,296 B2

(12) United States Patent
Hara et al.

(10) Patent No.: US 10,131,296 B2
(45) Date of Patent: Nov. 20, 2018

(54) INSERT BUS BAR PLATE AND METHOD FOR MANUFACTURING THE SAME

(71) Applicant: YAZAKI CORPORATION, Tokyo (JP)

(72) Inventors: Yasuhiro Hara, Shizuoka (JP); Hiroki Shiraiwa, Shizuoka (JP); Kazuomi Kiyosue, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 14/692,146

(22) Filed: Apr. 21, 2015

(65) Prior Publication Data
US 2015/0302954 A1 Oct. 22, 2015

(30) Foreign Application Priority Data

Apr. 21, 2014 (JP) ................................ 2014-087541

(51) Int. Cl.
*B60R 16/023* (2006.01)
*H05K 5/00* (2006.01)

(52) U.S. Cl.
CPC ....... *B60R 16/0238* (2013.01); *H05K 5/0047* (2013.01)

(58) Field of Classification Search
None
See application file for complete search history.

(56) References Cited

U.S. PATENT DOCUMENTS

| 4,639,056 A * | 1/1987 | Lindeman | H01R 13/405 |
| | | | 439/61 |
| 5,389,578 A * | 2/1995 | Hodson | G02B 6/4295 |
| | | | 438/25 |
| 5,802,709 A * | 9/1998 | Hogge | B32B 37/153 |
| | | | 156/324 |
| 6,153,140 A | 11/2000 | Hirai et al. | |

(Continued)

FOREIGN PATENT DOCUMENTS

| CN | 102769391 A | 11/2012 |
| JP | 2013-187525 A | 9/2013 |
| JP | 2013-198347 A | 9/2013 |

OTHER PUBLICATIONS

Communication dated Nov. 16, 2016 from the State Intellectual Property Office of the P.R.C. in counterpart Application No. 201510187870.9.

(Continued)

*Primary Examiner* — Dimary Lopez Cruz
(74) *Attorney, Agent, or Firm* — Sughrue Mion, PLLC

(57) ABSTRACT

An insert bus bar plate includes a plate-shaped resin material and a plurality of metal bus bars that are embedded within the resin material by insert molding and have a terminal part exposed to a mounting surface that is one of principal faces of the resin material. The bus bars are formed, before the insert molding, as a bus bar assembly before molding the one ends different from the terminal part of which are coupled to each other by a carrier to be cut after the insert molding. The insert bus bar plate (a substrate main body) is formed by the insert molding performed by oppositely arranging two bus bar assemblies before molding of the same shape so that two terminal parts are positioned in between two carriers.

6 Claims, 8 Drawing Sheets

(56) References Cited

U.S. PATENT DOCUMENTS

| | | | |
|---|---|---|---|
| 7,414,194 B2* | 8/2008 | Nakayama | H01R 9/223 174/68.2 |
| 2002/0028591 A1* | 3/2002 | Yuasa | H01R 9/2458 439/76.2 |
| 2004/0043645 A1* | 3/2004 | Yamakawa | H01R 4/029 439/76.2 |
| 2013/0235531 A1 | 9/2013 | Toda et al. | |
| 2013/0250489 A1 | 9/2013 | Toda et al. | |

OTHER PUBLICATIONS

Communication dated Feb. 6, 2018, from the Japanese Patent Office in counterpart application No. 2014-087541.

* cited by examiner

INSERT BUS BAR PLATE AND METHOD FOR MANUFACTURING THE SAME

CROSS-REFERENCE TO RELATED APPLICATIONS

The present application claims priority to and incorporates by reference the entire contents of Japanese Patent Application No. 2014-087541 filed in Japan on Apr. 21, 2014.

BACKGROUND OF THE INVENTION

1. Field of the Invention

The present invention relates to an insert bus bar plate and a method for manufacturing the same.

2. Description of the Related Art

Insert bus bar plates formed by embedding a plurality of metal bus bars within an insulating resin material by insert molding have been conventionally known (refer to Japanese Patent Application Laid-open No. 2013-198347, for example).

However, conventional insert bus bar plates have room for further improvement in the easiness of manufacturing when the bus bars are insert molded within the same resin material.

SUMMARY OF THE INVENTION

The present invention has been achieved in view of the above, and an object thereof is to provide an insert bus bar plate and a method for manufacturing the same with improved easiness of manufacturing.

According to one aspect of the present invention, an insert bus bar plate includes a plate-shaped resin material; and a plurality of metal bus bars configured to be embedded within the resin material by insert molding and have a terminal part exposed to at least one of principal faces of the resin material, wherein the plurality of bus bars are formed, before the insert molding, as a bus bar assembly before molding one ends different from the terminal part of which are coupled to each other by a carrier to be cut after the insert molding, and the insert bus bar plate is formed by the insert molding performed by oppositely arranging two bus bar assemblies before molding of the same shape so that terminal parts of the respective two bus bar assemblies before molding are positioned in between carriers of the respective two bus bar assemblies before molding.

According to another aspect of the present invention, a method for manufacturing an insert bus bar plate including a plate-shaped resin material; and a plurality of metal bus bars configured to be embedded within the resin material by insert molding and have a terminal part exposed to at least one of principal faces of the resin material, the method includes the steps of: forming a bus bar assembly before molding one ends of the plurality of bus bars different from the terminal part of which are coupled to each other by a carrier; oppositely arranging two bus bar assemblies before molding of the same shape formed at the forming so that terminal parts of the respective two bus bar assemblies before molding are positioned in between carriers of the respective two bus bar assemblies before molding; performing the insert molding on the two bus bar assemblies before molding oppositely arranged at the oppositely arranging; and cutting the carriers from the bus bar assemblies before molding embedded within the resin material by the insert molding at the performing the insert molding.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
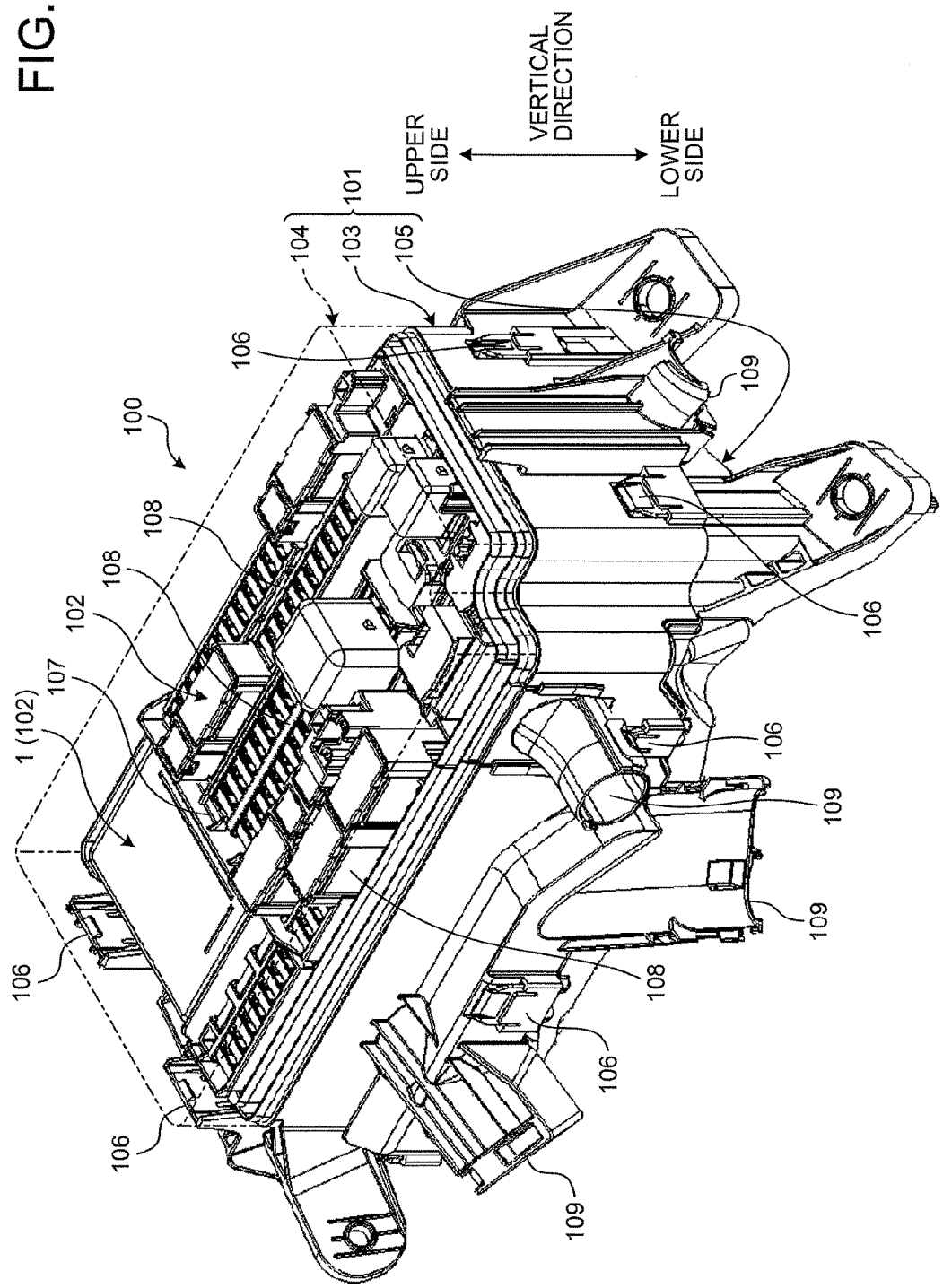
FIG. 1 is a perspective view illustrating a schematic configuration of an electrical connection box.

The following describes embodiments of an insert bus bar plate according to the present invention with reference to the drawings. In the drawings, the same reference numerals will be attached to the same or corresponding components, and descriptions thereof will not be repeated.

Embodiments

Figure 2:
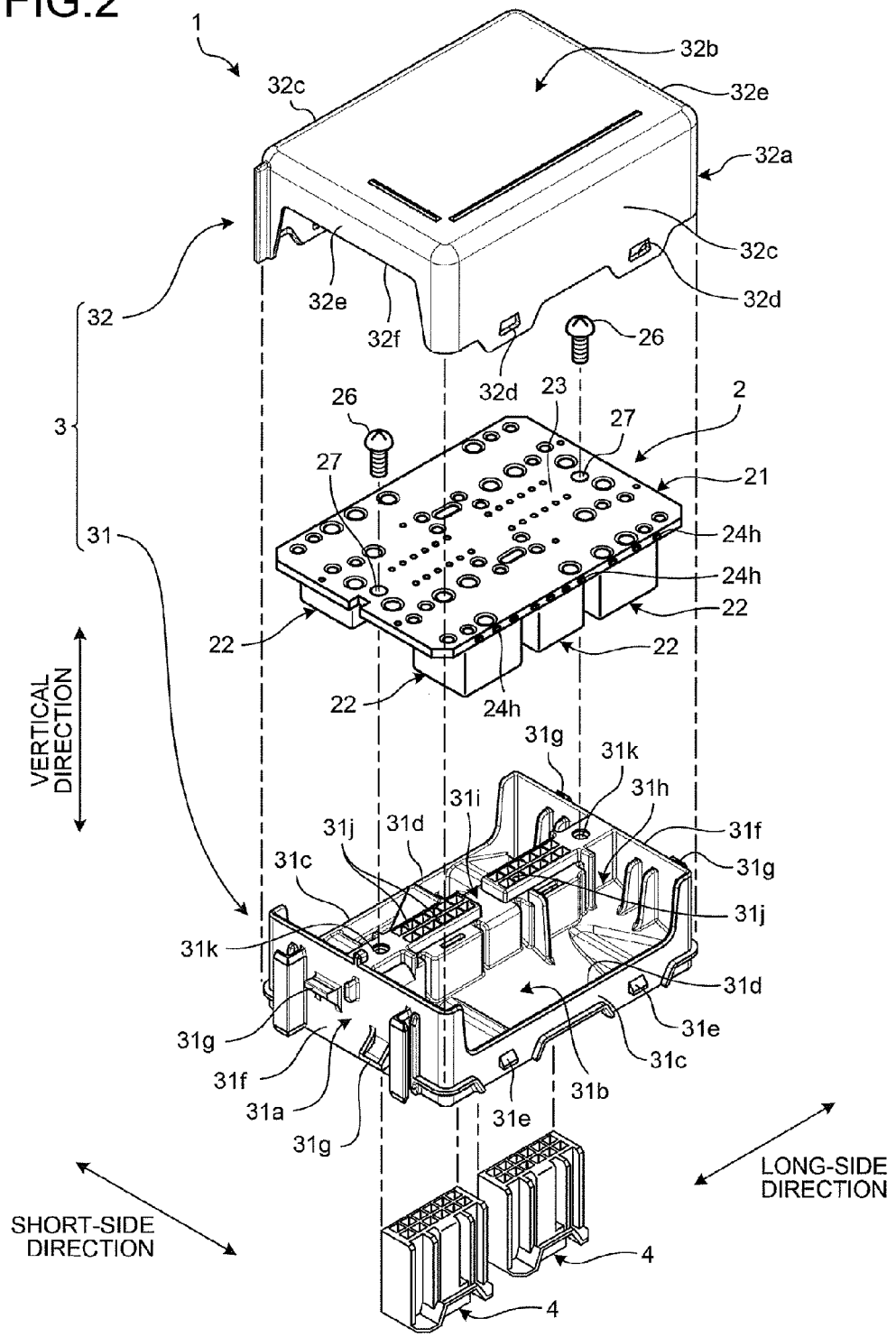
FIG. 2 is an exploded perspective view illustrating a schematic configuration of an electronic component unit in FIG. 1 for which an insert bus bar plate according to an embodiment of the present invention is used.
Figure 3:
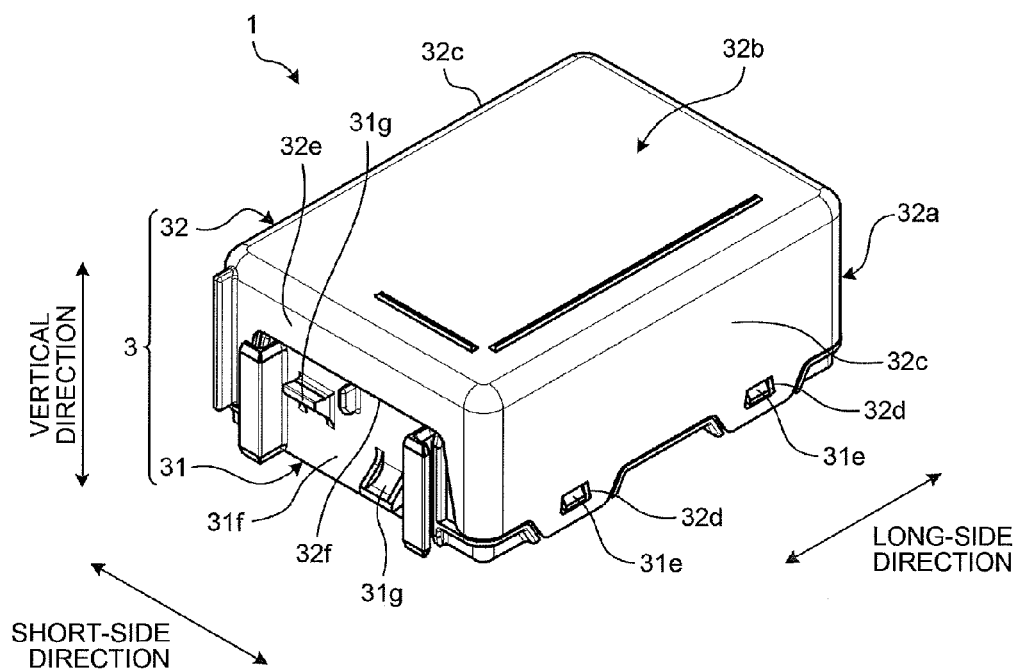
FIG. 3 is a perspective view illustrating a schematic configuration of the electronic component unit.
Figure 4:
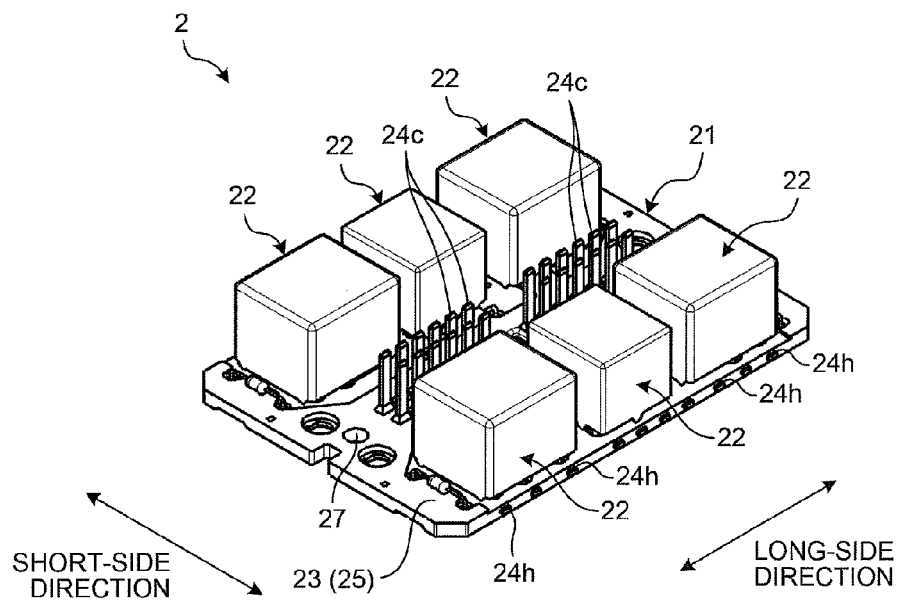
FIG. 4 is a perspective view illustrating a schematic configuration of the insert bus bar plate according to the embodiment.
Figure 5:
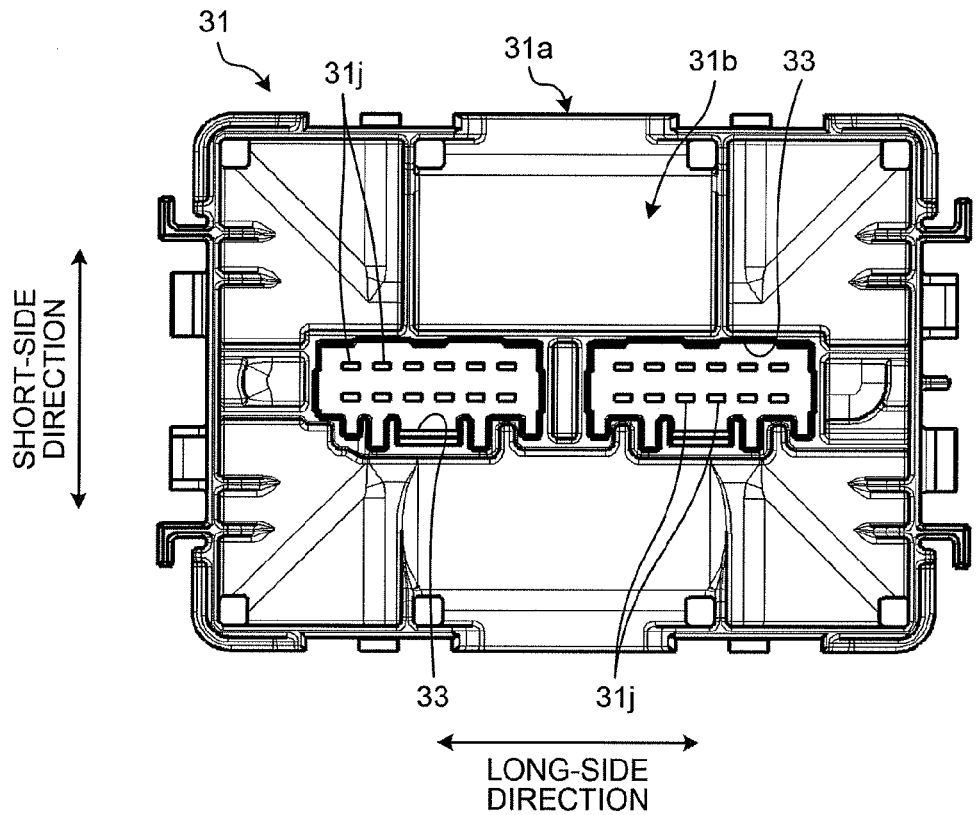
FIG. 5 is a plan view of a connector fitting part side of a base cover of the electronic component unit.
Figure 6:
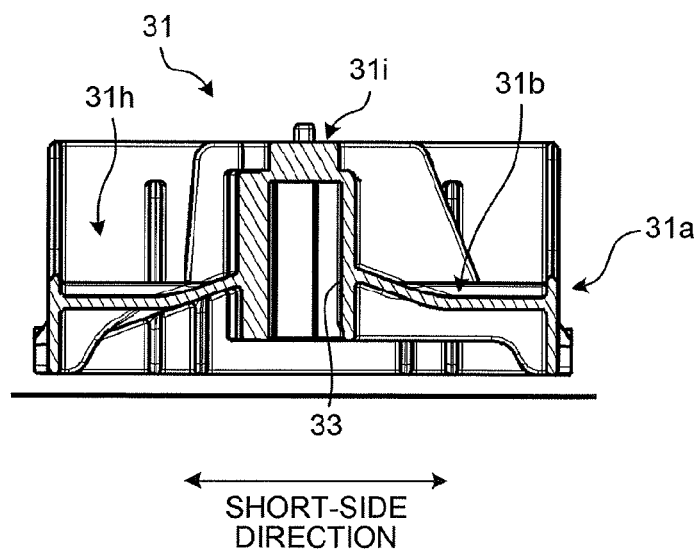
FIG. 6 is a sectional view including a connector fitting part of the base cover of the electronic component unit.

FIG. 1 is a perspective view illustrating a schematic configuration of an electrical connection box. FIG. 2 is an exploded perspective view illustrating a schematic configuration of an electronic component unit in FIG. 1 for which an insert bus bar plate according to an embodiment of the present invention is used. FIG. 3 is a perspective view illustrating a schematic configuration of the electronic component unit. FIG. 4 is a perspective view illustrating a schematic configuration of the insert bus bar plate according to the embodiment. FIG. 5 is a plan view of a connector fitting part side of a base cover of the electronic component unit. FIG. 6 is a sectional view including a connector fitting part of the base cover of the electronic component unit. FIG. 1 illustrates an upper cover of the electrical connection box with an alternate long and two short dashes line.

An insert bus bar plate 2 according to the present embodiment is used for an electronic component unit 1 illustrated in FIGS. 1 through 3. As illustrated in FIG. 1, the electronic component unit 1 constitutes an electronic component module detachably assembled to an electrical connection box 100 installed in vehicles such as automobiles. The electrical connection box 100 collectively houses therein connectors that constitute connection processing components for wire harnesses, electric wires, or the like, fuses, relays, branch parts, electronic control units, and other electric parts. The electrical connection box 100 is, for example, installed in an engine room of a vehicle or a lower part of a vehicle body and is connected to between a power supply such as a battery and various electronic devices installed in the vehicle. The electrical connection box 100 distributes electric power supplied from the power supply to the various electronic devices in the vehicle. The electrical connection box 100 may be called a junction box, a fuse box, a relay box, or the like, which are collectively called the electrical connection box in the present embodiment.

The electrical connection box 100 exemplified in FIG. 1 houses various electronic components 102 in a housing space within a box main body 101. The box main body 101 includes, for example, a body 103, an upper cover 104, and a lower cover 105. The box main body 101 has a three-layer divided structure divided into the body 103, the upper cover 104, and the lower cover 105. The body 103, the upper cover 104, and the lower cover 105 are formed of insulating synthetic resin. The body 103 is a main member forming the housing space to which the electronic components 102 are assembled. The body 103 is formed into a substantially hollow rectangular cylindrical shape, and openings are positioned on the vertical upper side and the vertical lower side with the electrical connection box 100 connected to the engine room or the like. The upper cover 104 is a lid-shaped member that blocks the opening on the vertical upper side of the body 103. The lower cover 105 is a dish-shaped (tray-shaped) member that blocks the opening on the vertical lower side of the body 103. In the box main body 101, the upper cover 104 is assembled to the vertical upper side of the body 103, whereas the lower cover 105 is assembled to the vertical lower side of the body 103 so that the opening on the vertical upper side of the body 103 and an opening of the upper cover 104 face each other and that the opening on the vertical lower side of the body 103 and an opening of the lower cover 105 face each other. In the box main body 101, the upper cover 104 and the lower cover 105 are locked to the body 103 through a lock mechanism 106 of various types. Although a direction in which the body 103, the upper cover 104, and the lower cover 105 are stacked is generally along the vertical direction with the electrical connection box 100 connected to the engine room or the like, the stacking direction may have a certain angle relative to the vertical direction depending on installation conditions of the electrical connection box 100.

The various electronic components 102 assembled to the housing space within the box main body 101 include, as described above, the electronic component unit 1 together with the connectors, fuses, relays, branch parts, electronic control units, and other electric parts. In the electrical connection box 100, the various electronic components 102 are assembled to the inside of many cavities formed by partition walls 107 of various shapes integrally formed with the body 103 and blocks 108 of various shapes detachably assembled to the body 103, and the like. In this case, the partition walls 107, the blocks 108, and the like are also formed of insulating synthetic resin similarly to the body 103 and the like. In the electrical connection box 100, terminals or the like of electric wires routed through openings 109 or the like are fitted to the cavities to which the various electronic components 102 are assembled from the vertical lower side and are electrically connected thereto.

As illustrated in FIG. 2 through FIG. 6, the electronic component unit 1 includes the insert bus bar plate 2 of the present embodiment, a housing 3, and connectors 4 as connection parts with electric wires, in which the insert bus bar plate 2 is assembled to the inside of the housing 3.

As illustrated in FIGS. 2 and 4, the insert bus bar plate 2 is a substrate in which metal bus bars 24 (refer to FIG. 12, for example) are incorporated in a resin material 23 on which electronic components 22 are mounted. The insert bus bar plate 2 includes a substrate main body 21 and the electronic components 22.

The substrate main body 21 incorporates the conductive bus bars 24 in the resin material 23, in which, in other words, the bus bars 24 are covered with the insulating resin material 23 to be isolated from each other. The substrate main body 21 is formed by, for example, insert molding, which injects insulating resin into around the bus bars 24 that are formed of conductive metal and placed in a mold to integrate the metal and the resin.

Figure 9:
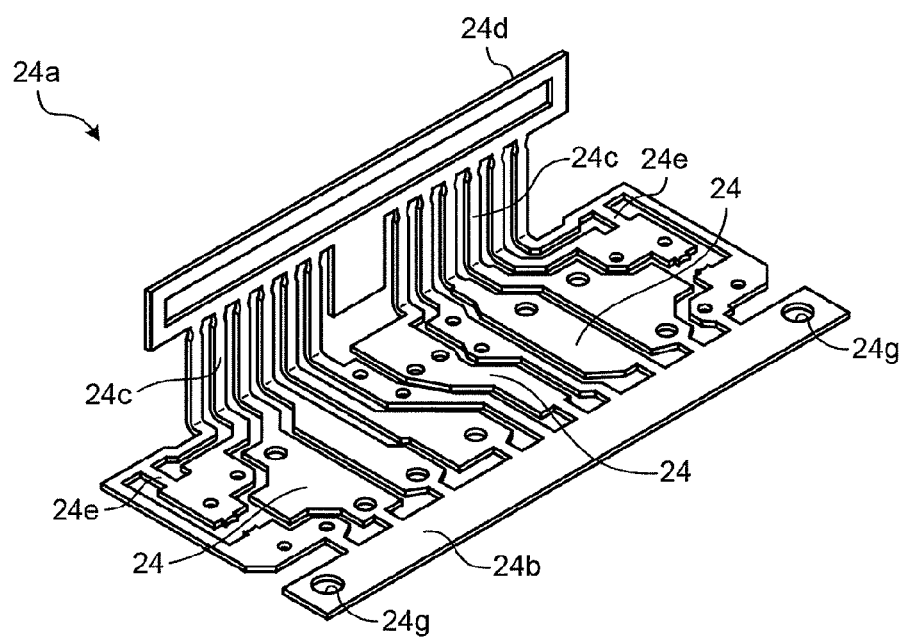
FIG. 9 is a diagram explaining Step S02 (a bending step) of the flowchart in FIG. 7.
Figure 10:
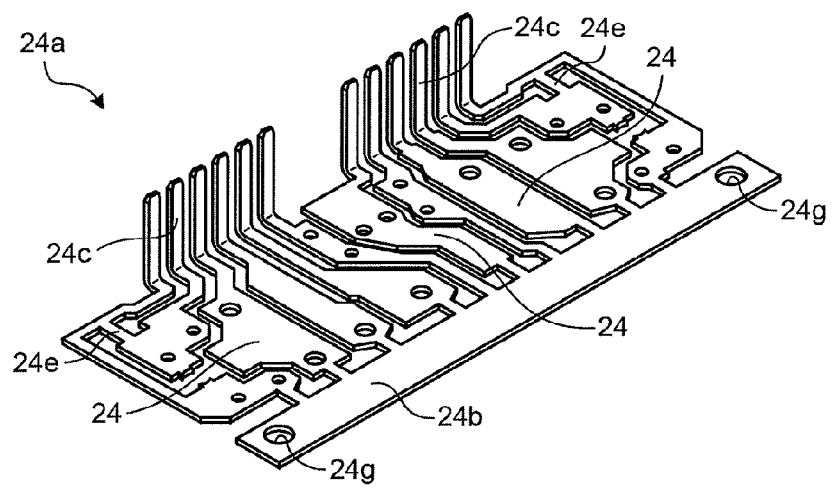
FIG. 10 is a diagram explaining Step S03 (a terminal-side carrier cutting step) of the flowchart in FIG. 7.

Before insert molding, a set of a plurality of bus bars 24 are configured as an assembly one ends of which are coupled to each other by a carrier 24b (refer to FIG. 10, for example). This assembly is expressed as a "bus bar assembly before molding 24a" in the present embodiment. The bus bar assembly before molding 24a is formed of conductive metal and is formed into, for example, a substantially plate shape as a whole by press working, for example. The bus bar assembly before molding 24a is inserted into a mold for insert molding with a terminal part 24c including a plurality of terminals of the respective bus burs 24 bent. The substrate main body 21 is formed by injecting insulating resin into around the bus bar assembly before molding 24a inserted into the mold to integrally mold the bus bars 24 and the resin material 23. In the substrate main body 21, the carrier 24b is cut after the bus bars 24 and the resin material 23 are integrally molded. The substrate main body 21 is formed into a rectangular plate shape as a whole. In the present embodiment in particular, within a single substrate main body 21 of the insert bus bar plate 2, two bus bar assemblies before molding 24a of the same shape are oppositely arranged so that two terminal parts 24c of the respective bus bar assemblies before molding 24a are positioned between two carriers 24b of the respective bus bar assemblies before molding 24a (refer to FIG. 11, for example). Details of a procedure of the insert molding of the insert bus bar plate 2 will be describe below with reference to FIGS. 7 through 13.

As illustrated in FIG. 4, for example, in the insert molded substrate main body 21, in the terminal parts 24c of the respective bus bar assembly before molding 24a, the terminals of the respective bus bard 24 are arranged at substantially the central part in a short-side direction (a first width direction) along a long-side direction (a second width direction perpendicular to the first width direction). The terminals of the respective bus bars 24 are arranged in two rows along the long-side direction. The respective terminals of the terminal parts 24c are erected substantially perpendicularly to a mounting face 25 on which the electronic components 22 are mounted in the substrate main body 21. In other words, the respective terminals of the terminal parts 24c protrude and extend from the mounting face 25 along a direction perpendicular to the short-side direction and the long-side direction. In other words, the respective terminals of the terminal parts 24c are exposed out of the mounting face 25 as one principal face of the substrate main body 21 (the resin material 23) so as to extend in the same direction. The respective terminals are positioned between the electronic components 22 described below relative to the short-side direction. In other words, the terminals of the terminal parts 24c are collected at the central part of the mounting face 25. In the substrate main body 21, ends on the side formerly coupled to the carriers 24b cut after insert molding are formed as exposed ends 24h exposed out of the resin material 23 on end faces of the substrate main body 21 in the respective bus bars 24. In other words, the insert bus bar plate 2 exposes the exposed ends 24h of the bus bars 24 on the end faces. The exposed ends 24h are formed on a pair of respective long-side end faces facing in the substrate main body 21. The exposed ends 24h are arranged and exposed on the respective long-side end faces in the long-side direction.

The electronic components 22 are mounted on the mounting face 25 of the substrate main body 21 and are elements that exhibit various functions in this embodiment. In the electronic components 22, the respective terminals of the terminal parts 24c are electrically connected to predetermined bus bars 24 and are fixed to the back of the mounting face 25 by soldering or the like. The electronic components 22 of the present embodiment are, for example, relays. In other words, the electronic component unit 1 is a relay unit module. The insert bus bar plate 2 of the present embodiment includes three relays as the electronic components 22 arranged on each side of the terminals of the terminal parts 24c in the short-side direction along the long-side direction, that is, a total of six relays. In other words, in the insert bus bar plate 2, the electronic components 22 are arranged in two rows, and the terminals of the terminal parts 24c are arranged in two rows in between the two rows of the electronic components 22. The insert bus bar plate 2 of the present embodiment basically has a shape that is substantially line symmetric relative to a center line along the long-side direction of the substrate main body 21 (that is, a center line in the short-side direction). The terminal parts 24c and the electronic components 22 are also arranged in substantially line symmetry. Elements such as relay resistors are also mounted on the insert bus bar plate 2 as the electronic components 22 in addition to the six relays.

As illustrated in FIG. 2, FIG. 3, FIG. 5, and FIG. 6, the housing 3 includes a base cover 31 as a base, a top cover 32 as a lid, and connector fitting parts 33 as connection part fitting parts. To the base cover 31, the insert bus bar plate 2 is assembled. The top cover 32 covers the insert bus bar plate 2 assembled to the base cover 31 from the side opposite to the base cover 31. The connector fitting parts 33, to which the connector's 4 as connection parts with the electric wires are fitted, are formed integrally with the base cover 31. The base cover 31, the top cover 32, and the connector fitting parts 33 are formed of insulating synthetic resin.

Specifically, as illustrated in FIG. 2, the base cover 31 is a dish-shaped (tray-shaped) member. The base cover 31 includes a rectangular frame-shaped part 31a formed into a substantially hollow rectangular shape and a base 31b that blocks the rectangular frame-shaped part 31a. The base 31b is formed into a rectangular plate shape similar to the substrate main body 21 of the insert bus bar plate 2. The rectangular frame-shaped part 31a is formed so as to surround the edge of the base 31b. The base 31b is formed integrally with the rectangular frame-shaped part 31a at a halfway height position of the rectangular frame-shaped part 31a (refer to FIG. 6, for example). In the rectangular frame-shaped part 31a, a pair of long-side wall faces 31c along the long-side direction of the base 31b are formed with notches 31d and engagement claws 31e to be engaged with the top cover 32. In the rectangular frame-shaped part 31a, a pair of short-side wall faces 31f along the short-side direction of the base 31b are formed with engagement claws 31g to be engaged with the box main body 101 of the electrical connection box 100. The base cover 31 is formed into a rectangular tubular shape (partially notched by the notches 31d) in which the halfway height position of the rectangular frame-shaped part 31a is blocked with the base 31b. In the base cover 31, a space surrounded by the rectangular frame-shaped part 31a and the base 31b is defined as a housing space 31h that houses therein the electronic components 22 of the insert bus bar plate 2.

The base cover 31 is formed with a central wall-shaped part 31i at the central part of the base 31b. The central wall-shaped part 31i is formed so that the base 31b protrudes toward the housing space 31h. The central wall-shaped part 31i is formed at substantially the central part of the base 31b in the short-side direction along the long-side direction. The central wall-shaped part 31i extends from one short-side wall face 31f to the other short-side wall face 31f along the long-side direction. The central wall-shaped part 31i is formed with a plurality of terminal fitting holes 31j and a pair of screw holes 31k on a top end face thereof. The terminal fitting holes 31j are holes to which the terminals of the respective bus bars 24 are fitted when the insert bus bar plate 2 is assembled to the base cover 31 and are formed in number and position corresponding to the terminals of the terminal parts 24c. The terminal fitting holes 31j are arranged in two rows along the long-side direction in this example. The screw holes 31k are holes to which, when the insert bus bar plate 2 is assembled to the base cover 31, screws 26 for tightening the insert bus bar plate 2 to the base cover 31 are screwed.

As illustrated in FIG. 5 and FIG. 6, in the base cover 31, the back side of the central wall-shaped part 31i, that is, the side opposite to the housing space 31h is hollowed, and the hollow part is formed as the connector fitting parts 33 to which the connectors 4 as the connection parts with the electric wires are fitted. The respective terminals of the terminal parts 24c of the respective bus bars 24 are exposed within the connector fitting parts 33 through the respective terminal fitting holes 31j, with the insert bus bar plate 2 assembled to the base cover 31. The connector fitting parts 33 are formed at two positions in this example, and a total of two connectors 4 are fitted to the two connector fitting parts 33 on a one-by-one basis. In other words, in the electronic component unit 1 of the present embodiment, the two connectors 4 are connected to the terminal parts 24c including the respective terminals of the bus bars 24.

As illustrated in FIG. 2, the top cover 32 is a lid-shaped member. The top cover 32 includes a rectangular frame-shaped part 32a formed into a substantially hollow rectangular shape and a ceiling 32b that blocks one opening of the rectangular frame-shaped part 32a. The ceiling 32b is formed into a rectangular plate shape similar to the substrate main body 21 of the insert bus bar plate 2 and the base 31b of the base cover 31. The rectangular frame-shaped part 32a is formed so as to be erected on the edge of the ceiling 32b. The rectangular frame-shaped part 32a is formed with engagement recesses 32d to be engaged with the base cover 31 in a pair of long-side wall faces 32c along the long-side direction of the ceiling 32b. In the rectangular frame-shaped part 32a, a pair of short-side wall faces 32e along the short-side direction of the ceiling 32b are formed with notches 32f. The top cover 32 is formed into a rectangular tubular shape (partially notched by the notches 32f) that opens on one end and is blocked on the other end by the rectangular frame-shaped part 32a and the ceiling 32b.

As illustrated in FIG. 2 and FIG. 3, in the electronic component unit 1 configured as described above, with the insert bus bar plate 2 assembled to the base cover 31 and with the side of the insert bus bar plate 2 opposite to the base cover 31 covered with the top cover 32, the connectors 4 are fitted to the connector fitting parts 33, thereby forming one module.

More specifically, in the electronic component unit 1, the insert bus bar plate 2 is assembled to the base cover 31 in a positional relation in which the electronic components 22 of the insert bus bar plate 2 are housed in the housing space 31h of the base cover 31, that is, in a positional relation in which the mounting face 25 (refer to FIG. 4, for example) on which the electronic components 22 are mounted faces the base 31b of the base cover 31. In the electronic component unit 1, with the insert bus bar plate 2 assembled to the base cover 31, the terminal parts 24c of the bus bars 24 of the insert bus bar plate 2 are fitted to the respective terminal fitting holes 31j of the base cover 31, and the respective terminals of the terminal parts 24c are exposed within the connector fitting parts 33 along a direction perpendicular to the short-side direction and the long-side direction. In the electronic component unit 1, the screws 26 are inserted into screw holes 27 of the insert bus bar plate 2 and are screwed to the screw holes 31k of the base cover 31, thereby tightening the insert bus bar plate 2 and the base cover 31 with each other. In the electronic component unit 1, with the insert bus bar plate 2 assembled to the base cover 31, three electronic components 22 are positioned on each side of the central wall-shaped part 31i in the short-side direction.

In the electronic component unit 1, the top cover 32 is fitted to the base cover 31 and the like in a positional relation in which the insert bus bar plate 2 assembled to the base cover 31 is covered with the top cover 32 from the side opposite to the base cover 31. In the electronic component unit 1, with the top cover 32 fitted to an appropriate position, the respective engagement recesses 32d of the top cover 32 are engaged with the respective engagement claws 31e of the base cover 31, thereby assembling the top cover 32 to the base cover 31. As illustrated in FIG. 3, for example, in the electronic component unit 1, with the top cover 32 assembled to the base cover 31, the rectangular frame-shaped part 32a of the top cover 32 is positioned so as to overlap the outside of the rectangular frame-shaped part 31a of the base cover 31, and the engagement claws 31g are exposed out of the notches 32f of the top cover 32. In the electronic component unit 1, the connectors 4 are fitted to the connector fitting parts 33 along the direction perpendicular to the short-side direction and the long-side direction, thereby connecting the connectors 4 to the terminal parts 24c including the respective terminals of the bus bars 24 and causing the electronic component unit 1 to be assembled to a predetermined place within the box main body 101 of the electrical connection box 100 via the engagement claws 31g.

Although a stacking direction in which the base cover 31, the insert bus bar plate 2, and the top cover 32 are stacked is along the vertical direction with the electrical connection box 100 connected to the engine room or the like similarly to the electrical connection box 100, the stacking direction may have a certain angle relative to the vertical direction depending on installation conditions of the electrical connection box 100.

Figure 7:
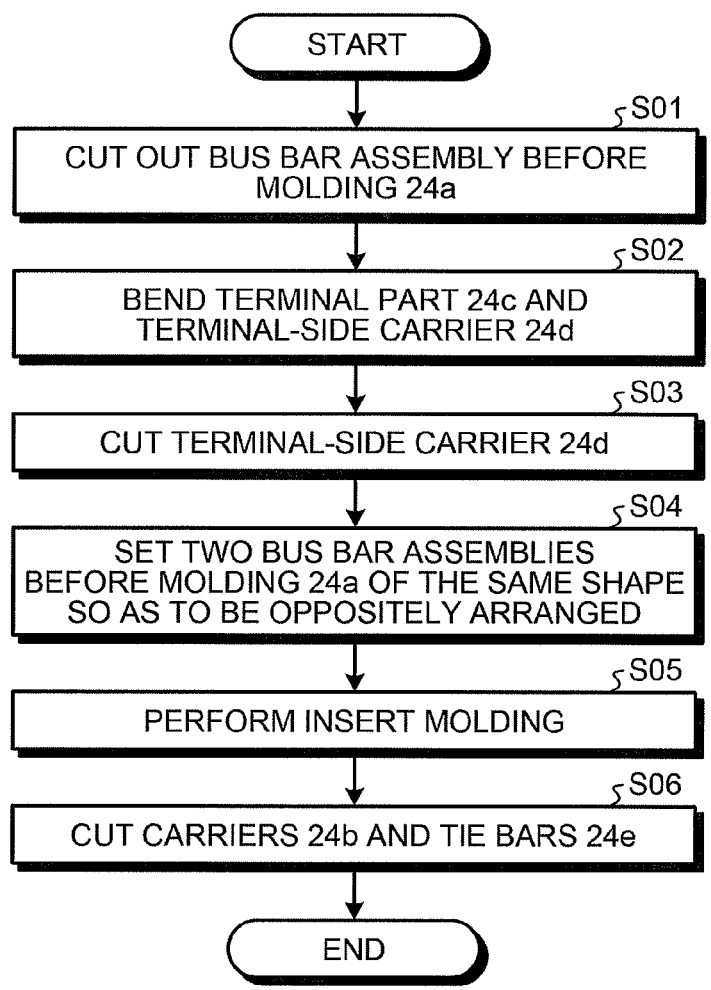
FIG. 7 is a flowchart illustrating a method for manufacturing the insert bus bar plate according to an embodiment of the present invention.
Figure 8:
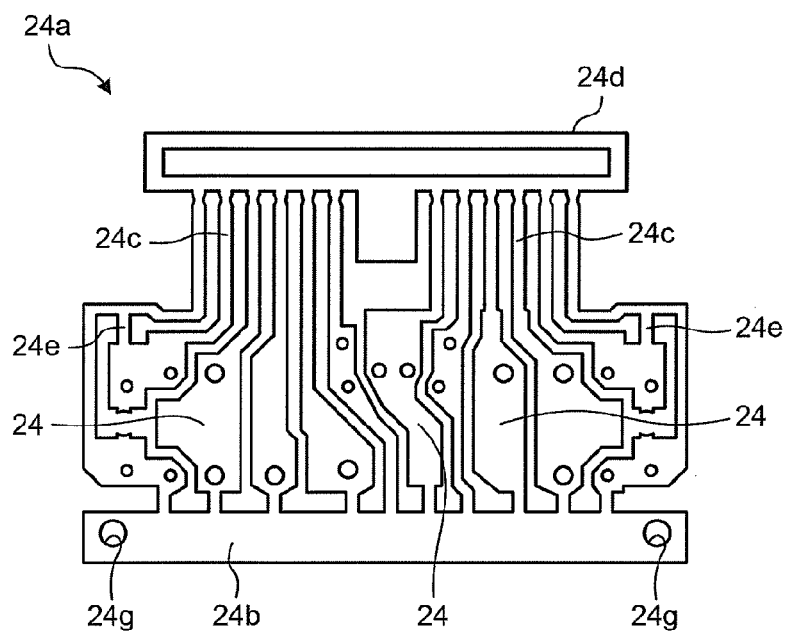
FIG. 8 is a diagram explaining Step S01 (a cutting-out step) of the flowchart in FIG. 7.
Figure 11:
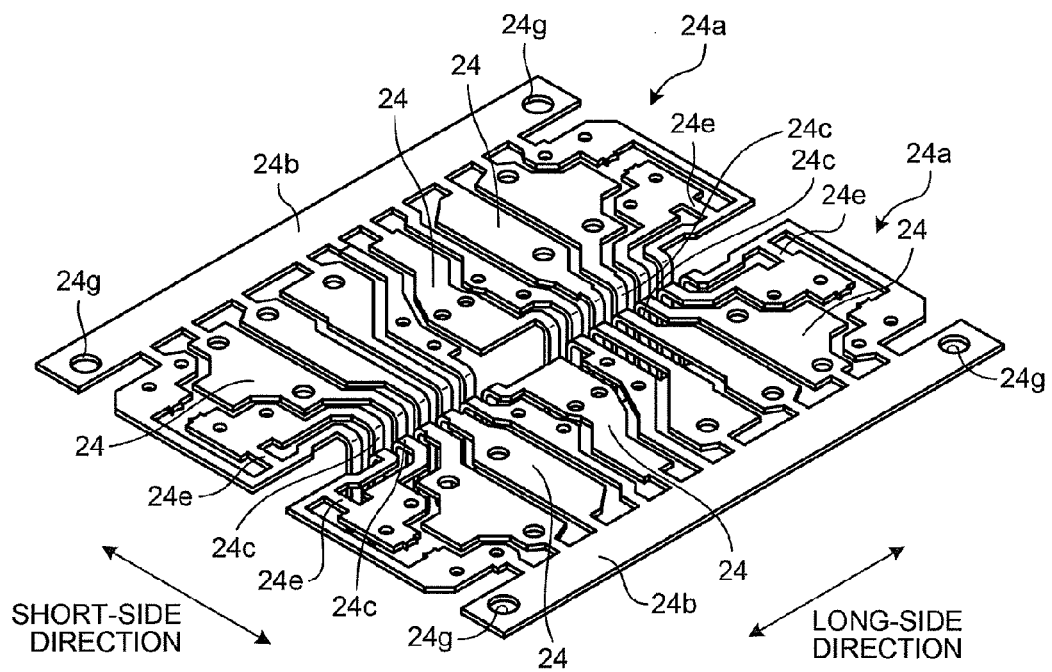
FIG. 11 is a diagram explaining Step S04 (an oppositely arranging step) of the flowchart in FIG. 7.
Figure 12:
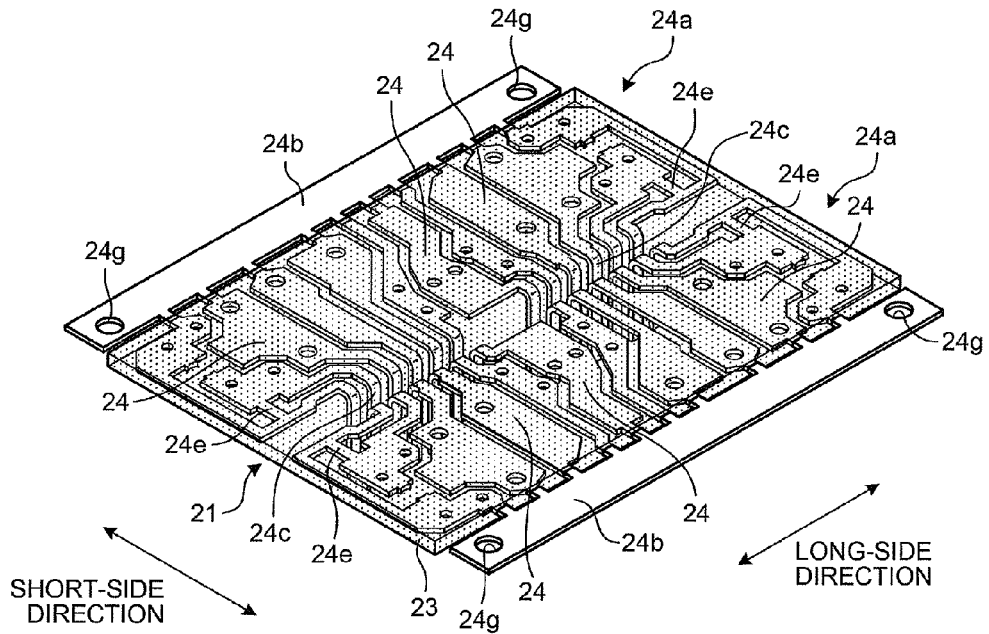
FIG. 12 is a diagram explaining Step S05 (an insert molding step) of the flowchart in FIG. 7.
Figure 13:
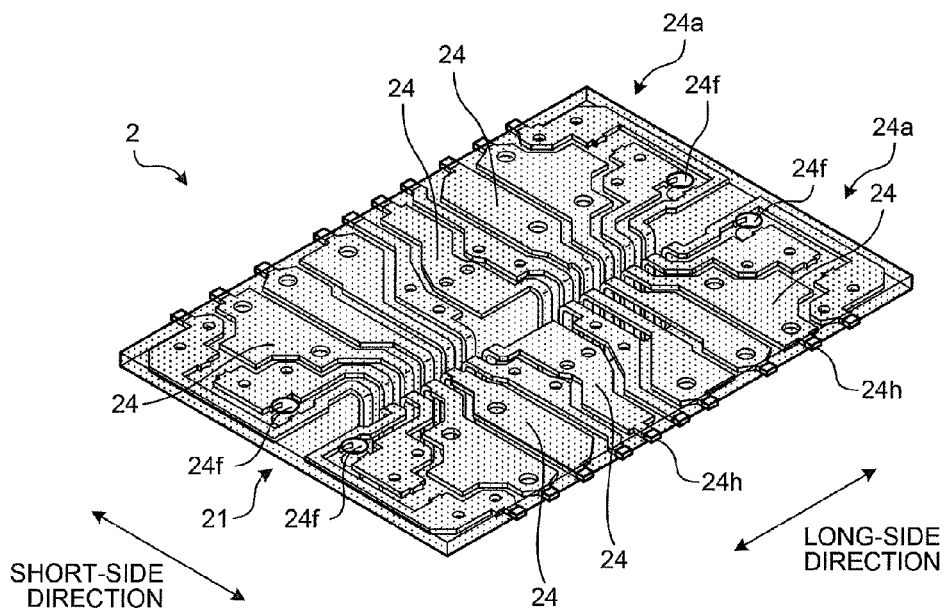
FIG. 13 is a diagram explaining Step S06 (a carrier cutting step) of the flowchart in FIG. 7.

Described next with reference to FIGS. 7 through 13 is a procedure of insert molding of the insert bus bar plate 2 according to the present embodiment (a method for manufacturing the insert bus bar plate 2). FIG. 7 is a flowchart illustrating a method for manufacturing the insert bus bar plate according to an embodiment of the present invention. FIG. 8 is a diagram explaining Step S01 (a cutting-out step) of the flowchart in FIG. 7. FIG. 9 is a diagram explaining Step S02 (a bending step) of the flowchart in FIG. 7. FIG. 10 is a diagram explaining Step S03 (a terminal-side carrier cutting step) of the flowchart in FIG. 7. FIG. 11 is a diagram explaining Step S04 (an oppositely arranging step) of the flowchart in FIG. 7. FIG. 12 is a diagram explaining Step S05 (an insert molding step) of the flowchart in FIG. 7. FIG. 13 is a diagram explaining Step S06 (a carrier cutting step) of the flowchart in FIG. 7. The following describes the method for manufacturing the insert bus bar plate 2 according to the flowchart in FIG. 7 while referring to FIGS. 8 through 13.

At Step S01 of the flowchart in FIG. 7, the bus bar assembly before molding 24a is cut out of a conductive metallic plate (a cutting-out step). As illustrated in FIG. 8, at this step, the bus bar assembly before molding 24a is formed into a substantially plate shape as a whole by press working, for example. As illustrated in FIG. 8, the bus bar assembly before molding 24a at this step includes the carrier 24b coupled to one ends of a set of a plurality of bus bars 24 and a terminal-side carrier 24d coupled to each of the terminal part 24c on the other ends of the bus bars 24 opposite to the carrier 24b. Both the carrier 24b and the terminal-side carrier 24d are elongated plate-shaped members that extend along the arrangement direction of the bus bars 24 (the long-side direction) and have the long-side direction as the longitudinal direction. Among the bus bars 24, one that is not connected to one of the carrier 24b and the terminal-side carrier 24d is coupled to an adjacent bus bar 24 through a tie bar 24e to be held on a plane together with the other bus bars 24. As illustrated in FIG. 8, in the present embodiment, two tie bars 24e are provided for a single bus bar assembly before molding 24a. Upon completion of the processing at Step S01, the process advances to Step S02.

At Step S02, the terminal part 24c and the terminal-side carrier 24d of the bus bar assembly before molding 24a are bent (a bending step). This step, as illustrated in FIG. 9, causes the terminal part 24c and the terminal-side carrier 24d to be bent at a substantially right angle relative to the bus bars 24 and the carrier 24b. Upon completion of the processing at Step S02, the process advances to Step S03.

At Step S03, the terminal-side carrier 24d is cut from the bus bar assembly before molding 24a (a terminal-side carrier cutting step). The cutting of the terminal-side carrier 24d is performed by hand or using a cutting blade, for example. This step, as illustrated in FIG. 10, causes only the terminal part 24c to be bent at a substantially right angle relative to the bus bars 24 and the carrier 24b. In the present embodiment, only a plurality of bus bar assemblies before molding 24a of the same shape are manufactured as the bus bar assembly before molding 24a. The "bus bar assemblies before molding 24a of the same shape" indicate ones having the arrangement pattern of the bus bars 24 and the same connection relation between the bus bars 24 and the carrier 24b and the terminal part 24c. More specifically, the "bus bar assemblies before molding 24a of the same shape" indicate ones in which a pair of holes 24g for positioning provided on both ends of the carrier 24b are arranged at symmetric positions and having perfectly the same shape including with regard to the accompanying carrier 24b, not only the bus bars 24. Upon completion of the processing at Step S03, the process advances to Step S04.

A series of pieces of processing at S01 through S03 can be also collectively expressed as a "forming step" for forming the bus bar assembly before molding 24*a* the one ends of the bus bars 24 different from the terminal part 24*c* of which are coupled to each other by the carrier 24*b*.

At Step S04, two bus bar assemblies before molding 24*a* of the same shape are set in a mold for insert molding (not illustrated) so as to be oppositely arranged (an oppositely arranging step). At this step, as illustrated in FIG. 11, two bus bar assemblies before molding 24*a* subjected to the processing described at Step S03 are used. The carriers 24*b* of the respective bus bar assemblies before molding 24*a* are arranged so that the long-side direction of the substrate main body 21 after being molded is the longitudinal direction. This arrangement causes the bent terminals of the respective bus bars 24 to be also arranged along the long-side direction. In other words, the terminal parts 24*c* of the respective bus bar assemblies before molding 24*a* are formed so that the terminals are arranged along the longs-side direction. The terminals of the respective terminal parts 24*c* are inserted into the inside of the mold at a substantially central position of the substrate main body 21 after being molded in the short-side direction (downward in FIG. 11). In the two opposing bus bar assemblies before molding 24*a*, the terminal parts 24*c* of the two opposing bus bar assemblies before molding 24*a* are arranged at the closest positions along the short-side direction and are arranged so as to extend in the same direction. The bus bars 24 and the carriers 24*b* of the two bus bar assemblies before molding 24*a* are arranged on the same plane, and the carriers 24*b* of the two opposing bus bar assemblies before molding 24*a* are arranged at the farthest positions along the short-side direction in contrast to the terminal parts 24*c*.

Putting the "opposite arrangement" of such two bus bar assemblies before molding 24*a* of the same shape in another way, it can also be expressed that the two bus bar assemblies before molding 24*a* are arranged in point symmetry about the central part (the central position of the substrate main body 21 in the long-side direction and the short-side direction) of the insert bus bar plate 2 (the substrate main body 21) after being molded (refer to FIG. 12). This arrangement also means that the electronic components 22 mounted on the mounting face 25 of the substrate main body 21 after being molded are also arranged in point symmetry about the central part of the mounting face 25. Putting it in another way further, it can also be expressed that the two bus bar assemblies before molding 24*a* of the same shape are arranged so that the two terminal parts 24*c* of the respective bus bar assemblies before molding 24*a* are positioned in between the two carriers 24*b* of the respective bus bar assemblies before molding 24*a*. Upon completion of the processing at Step S04, the process advances to Step S05.

At Step S05, insert molding is performed that injects insulating resin into around the two bus bar assemblies before molding 24*a* inserted into the mold (an insert molding step). This process causes, as illustrated in FIG. 12, the bus bars 24 of the respective bus bar assemblies before molding 24*a* and the resin material 23 to be integrally molded to form the substrate main body 21. The bus bars 24 of the respective bus bar assemblies before molding 24*a* are embedded within the substrate main body 21 (the resin material 23) while being insulated from each other by the resin material 23. The insert molding is performed so that tips of the carriers 24*b* and the terminal parts 24*c* of the bus bar assemblies before molding 24*a* are exposed out of the substrate main body 21 (the resin material 23). Upon completion of the processing at Step S05, the process advances to Step S06.

At Step S06, as illustrated in FIG. 13, after the insert molding, the carriers 24*b* are cut from the bus bar assemblies before molding 24*a* embedded within the resin material 23 by the insert molding (a carrier cutting step), and the positions of tie bars 24*e* are punctured from the surface of the substrate main body 21 to cut the tie bars 24*e*. The cutting of the carriers 24*b* can be performed with a cutting blade, for example. The cutting of the tie bars 24*e* can be performed using a punch for tie bar cutting, for example. As described above, in the present embodiment, two tie bars 24*e* are provided for a single bus bar assembly before molding 24*a*, and for the substrate main body 21 within which two bus bar assemblies before molding 24*a* are embedded, a total of four points are punctured to form holes 24*f* as illustrated in FIG. 13. Through such a procedure, the insert bus bar plate 2 (the substrate main body 21) is manufactured. Upon completion of the processing at Step S06, a series of pieces of processing related to the insert molding of the insert bus bar plate 2 ends.

Next, effects of the insert bus bar plate 2 according to the present embodiment will be described.

The following considers a configuration in which a plurality of bus bar assemblies before molding of different shapes are embedded in a single insert bus bar plate. When insert molding is performed, if an operator makes a mistake about installation positions of the bus bar assemblies before molding, a finished product may fail to exhibit desired functions. Given this situation, it is required to provide some structure in products or equipment to prevent misinstallation of the bus bar assemblies before molding of different shapes at the time of installing the bus bar assemblies before molding in the insert molding. Examples of the structure include changing the shape of the pair of holes 24*g* for positioning of the carriers 24*b* and making the positions of the pair of holes 24*g* asymmetric.

In contrast, the insert bus bar plate 2 (the substrate main body 21) of the present embodiment includes the plate-shaped resin material 23 and the metal bus bars 24 that are embedded within the resin material 23 by insert molding and have the terminal parts 24*c* exposed to the mounting face 25 as one of principal faces of the resin material 23 (the substrate main body 21). The bus bars 24 are formed as the bus bar assemblies before molding 24*a* the one ends different from the terminal parts 24*c* of which are coupled to each other by the carriers 24*b* to be cut after the insert molding, before the insert molding. The insert bus bar plate 2 (the substrate main body 21) is formed by the insert molding performed by oppositely arranging the two bus bar assemblies before molding 24*a* of the same shape so that the two terminal parts 24*c* are positioned in between the two carriers 24*b*.

With this configuration, when insert molding is performed, an operator can accurately arrange the two bus bar assemblies before molding 24*a* simply by taking care to arrange the terminal parts 24*c* in between the carriers 24*b* of the respective two bus bar assemblies before molding 24*a* of the same shape and to align installation directions of the respective terminal parts 24*c* to the same direction, and the occurrence of misinstallation of components can be reduced even when no special measures are taken compared with the configuration that uses bus bar assemblies before molding of different shapes. Consequently, workloads at the time of insert molding can be reduced, and the easiness of manufacturing of the insert bus bar plate 2 can be improved. The insert bus bar plate 2 can be manufactured using the bus bar assemblies before molding 24a of the same shape alone, and the cost of manufacturing molds for molding the bus bar assemblies before molding 24a can be reduced.

Similarly, the method for manufacturing the insert bus bar plate 2 according to the present embodiment, more specifically, the procedure of the insert molding of the substrate main body 21 of the insert bus bar plate 2 includes the forming step for forming the bus bar assembly before molding 24a the one ends of the bus bars 24 different from the terminal part 24c of which are coupled to each other by the carrier 24b (Steps S01 through S03 of the flowchart in FIG. 7), the oppositely arranging step for oppositely arranging the two bus bar assemblies before molding 24a of the same shape formed at the forming step so that the two terminal parts 24c are positioned in between the two carriers 24b (Step S04), the insert molding step for performing insert molding on the two bus bar assemblies before molding 24a oppositely arranged at the oppositely arranging step (Step S05), and the carrier cutting step for cutting the carriers 24b from the bus bar assemblies before molding 24a embedded within the resin material 23 by the insert molding at the insert molding step (Step S06). The manufacturing method also produces a similar effect to the effect by the insert bus bar plate 2 itself of the present embodiment described above.

Although the above embodiments exemplify a configuration in which the insert bus bar plate 2 is used for the electronic component unit 1, embodiments are not so limited. Although the above embodiments exemplify a case in which the electronic components 22 mounted on the insert bus bar plate 2 are relays, they are not limited to relays and may be other electronic components such as fuses.

The above embodiments exemplify a configuration in which both the terminal parts 24c of the respective two oppositely arranged bus bar assemblies before molding 24a are exposed so as to extend from the mounting face 25 as one of the principal faces of the substrate main body 21 (the resin material 23) in the same direction. In another possible configuration, only the terminal part 24c of one bus bar assembly before molding 24a is exposed to the mounting face 25 as one of the principal faces of the substrate main body 21 (the resin material 23), while the terminal part 24c of the other bus bar assembly before molding 24a may be exposed to the other principal face on the back of the mounting face 25.

The present invention produces an effect of improving the easiness of manufacturing.

Although the embodiment of the present invention has been described, the embodiment is presented as an example and has no intention of limiting the scope of the invention. The above embodiments can be embodied in other various forms, and various omissions, substitutions, or changes can be made thereto without departing from the essence of the invention. The above embodiments and modifications thereof are included in the scope and essence of the invention, and similarly, included in the inventions described in the claims and the scope of equivalents thereof.

What is claimed is:

1. An insert bus bar plate comprising:
a plate-shaped resin material; and
a pair of metal bus bar assemblies embedded in the resin material, each metal bus bar assembly comprising:
a plurality of terminal parts at one end thereof, which are exposed to at least one of principal faces of the resin material, and
a carrier at another end different from the terminal parts,
wherein the terminal parts are bent at a substantially right angle relative to the at least one of principal faces of the resin material,
wherein said pair of metal bus bar assemblies are of the same shape and are oppositely arranged so that the terminal parts of the respective pair of metal bus bar assemblies are positioned in the resin material such that the terminal parts are disposed in between carriers of the respective pair of metal bus bar assemblies,
said carriers of the respective pair of metal bus bar assemblies are configured to be removed after the pair of metal bus bar assemblies are embedded within the resin material and are arranged on the same plane with bus bars of the pair of metal bus bar assemblies, and
said principal faces of the resin material are parallel to the plane in which the bus bars of the pair of metal bus bar assemblies and the carriers are arranged.

2. The insert bus bar plate according to claim 1, wherein the terminal parts of the respective pair of metal bus bar assemblies extend in the same direction.

3. The insert bus bar plate according to claim 1, wherein the terminal parts are covered with an insulating resin and are bent.

4. The insert bus bar plate according to claim 3, wherein the terminal parts are covered with an insulating resin and are oppositely arranged.

5. The insert bus bar plate according to claim 4, wherein the pair of metal bus bar assemblies before molding of the same shape are covered with an insulating resin in a state where the pair of metal bus bar assemblies before molding are oppositely arranged so that the terminal parts of the respective pair of metal bus bar assemblies before molding are positioned in between two carriers of the respective pair of metal bus bar assemblies before molding.

6. The insert bus bar plate according to claim 1, wherein bent portions of the terminal parts are covered with an insulating resin.

* * * * *